United States Patent [19]

Balasubramanyam et al.

[11] Patent Number: 4,689,113
[45] Date of Patent: Aug. 25, 1987

[54] PROCESS FOR FORMING PLANAR CHIP-LEVEL WIRING

[75] Inventors: Karanam Balasubramanyam, Hopewell Junction; Anthony J. Dally, Pleasant Valley; Jacob Riseman, Poughkeepsie; Seiki Ogura, Hopewell Junction, all of N.Y.

[73] Assignee: International Business Machines Corporation, Armonk, N.Y.

[21] Appl. No.: 842,576

[22] Filed: Mar. 21, 1986

[51] Int. Cl.$^4$ .......................... B44C 1/22; C23F 1/02; C03C 15/00; B29C 37/00
[52] U.S. Cl. ........................... 156/643; 156/646; 156/653; 156/656; 156/657; 156/659.1; 156/661.1; 156/668; 156/904; 204/192.32; 357/65; 357/67; 357/71; 430/314; 430/315; 430/317; 430/318; 437/228
[58] Field of Search ............... 156/643, 644, 646, 652, 156/653, 656, 657, 659.1, 661.1, 662, 904, 668; 204/192 E; 357/65, 67, 71; 427/38, 39, 88, 89; 430/313, 314, 315, 316, 317, 318; 29/576 W

[56] References Cited

U.S. PATENT DOCUMENTS

| | | | |
|---|---|---|---|
| 2,559,389 | 7/1951 | Beeber et al. | 41/43 |
| 3,849,136 | 11/1974 | Grebe | 96/36.2 |
| 3,873,361 | 3/1975 | Franco et al. | 117/212 |
| 4,004,044 | 1/1977 | Franco et al. | 427/43 |
| 4,076,860 | 2/1978 | Kuroda | 427/91 |
| 4,307,179 | 12/1981 | Chang et al. | 430/314 |
| 4,508,815 | 4/1985 | Ackmann et al. | 430/314 |
| 4,575,402 | 3/1986 | Marcoux et al. | 156/646 X |
| 4,599,243 | 7/1986 | Sachder et al. | 156/643 X |

OTHER PUBLICATIONS

IBM Technical Disclosure Bulletin, vol. 24, No. 9, Feb. 1982, pp. 4839-4840, by A. J. Hoeg, Jr. et al., "Metal Lift-Off Process with a Self-Aligned Insulation Planarization".

IBM Technical Disclosure Bulletin, vol. 25, No. 10, Mar. 1983, pp. 5309-5314, by G. T. Chiu et al, "Process for Multilayer Metal Technology".

1982 IEEE IEDM 82—pp. 391-394, by B. J. Lin, "Multi-Layer Resist Systems as a Means to Submicron Optical Lithography".

Primary Examiner—William A. Powell
Attorney, Agent, or Firm—T. Rao Coca

[57] ABSTRACT

Disclosed is a process of forming high density, planar, single- or multi-level wiring for a semiconductor integrated circuit chip. On the chip surface is provided a dual layer of an insulator and hardened photoresist having various sized openings (grooves for wiring and openings for contacts) therein in a pattern of the desired wiring. A conductive (e.g., metal) layer of a thickness equal to that of the insulator is deposited filling the grooves and contact openings. A sacrificial dual (lower and upper component) layer of (hardened) photoresist is formed filling the metal valleys and obtaining a substantially planar surface. The lower component layer is thin and conformal and has a higher etch rate than the upper component layer which is thick and nonconformal. By reactive ion etching the sacrificial layer is removed leaving resist plugs in the metal valleys. Using the plug as etch masks, the exposed metal is removed followed by removal of the remaining hardened photoresist layer and the plugs leaving a metal pattern coplanar with the insulator layer. This sequence of steps is repeated for multilevel wiring.

When only narrow wiring is desired, a single photoresist layer is substituted for the dual photoresist sacrificial layer.

21 Claims, 9 Drawing Figures

PROCESS FOR FORMING PLANAR CHIP-LEVEL WIRING

BACKGROUND OF THE INVENTION

The invention relates to a process for forming planar single or multilevel thin film wiring for interconnection of semiconductor integrated circuit devices, and more particularly, to a process for forming filled planar wiring and plugged contact hole(s) in a passivated semiconductor substrate.

Since the discovery of the planar transistor which enabled all the terminals of the transistor elements to be exposed on the surface of the chip and allowed the terminals of a large number of transistors to be connected together by a single deposition process, there has been an inexorable advance in device integration. The device density increase has been brought about principally by lateral shrinkage of the device dimensions. For example, at present 256 K dynamic random access memories (DRAM) are being mass-produced incorporating 400,000 transistors on a chip and having a pattern linewidth of about 2 $\mu$m. The degree of integration has been trebling every four years. This trend is expected to continue. The present projection is that 4M DRAMs with a 0.7 $\mu$m linewidth will be a reality in 1988 and 100M DRAMs with linewidths of 0.25 $\mu$m incorporating approximately 100,000,000 transistors on a single chip will be devloped by the end of the present century.

As device density increases, the nature of the thin film interconnection metallization or wiring, which is the medium for electrically connecting the device components of the individual circuits to provide the logic or memory function of a chip, becomes extremely important. The interconnection must have functionality, i.e., it must complete all the connections to achieve the function desired of the chip without deleteriously affecting the performance or speed thereof. In this context, wireability, capacitance and resistivity are primary considerations. The design of the width of and spacing between wiring lines be such as to accommodate the wiring in the available limited chip real estate. The capacitance between interconnection lines at the same wiring plane and between planes should be a minimum. This necessitates use of an insulator material having a low dielectric constant, minimizing the thickness of the lines in a given wiring plane and maximizing the thickness of the insulator between wiring planes. High resistivity of the interconnection lines leads to large voltage drops and, therefore, unacceptable from a circuit performance standpoint. Another requirement of the interconnection is that it be reliable. That is, the wiring should be free from electromigration, junction penetration, corrosion and, in the case of multilevel systems, interlevel breakdown problems. Yet another requirement of the interconnection is that it be easily manufacturable, meaning that the process and materials combination have a large processing window so that routine manufacturing gives an acceptable yield. In addition to good yield, the process-material set should guarantee that the final product is free of defects which lead to failure during use.

A conventional method of forming thin film interconnection metallization in a fine pattern is by the additive process known as the lift-off method. The basic lift-off method is described in U.S. Pat. No. 2,559,389. Improvements to this method have been made as described in U.S. Pat. Nos. 3,849,136 and 3,873,361, all of which patents are assigned to the present assignee. In this method, typically, a semiconductor device substrate is coated with an organic photoresist material having a pattern of openings in accordance with the desired metallization pattern. A conductive metal layer is deposited on the resulting structure. The photoresist is then stripped off using a wet chemical etchant thereby removing the metal layer over the photoresist while leaving a metal pattern in contact with the substrate surface.

An improvement to the above lift-off method is disclosed in U.S. Pat. No. 4,004,044 issued to Franco et al and assigned to the present assignee. In this method a dual layer of a photoresist and polydimethylsiloxane resin materials is deposited on the substrate. Using a second photoresist layer having openings therein as a mask formed over the resin material, the latter is sputter etched. Using the defined resin material as a mask the first photoresist is, in turn, sputter etched to expose the regions of the substrate and also produce overhangs of the openings in the resin layer which facilitates easy lift off. Metal is then deposited onto the substrate through the openings in the resin and first photoresist followed by lift-off of these mask materials.

U.S. Pat. No. 4,076,860 issued to Kuroda discloses a method of forming thicker wiring than obtained by the lift-off process. In this process, after forming a nonplanar conductor film by the lift-off process utilizing a first layer of photoresist, a second photoresist is applied filling the valleys in the metal layer. Using the second photoresist as an etch mask unwanted metal is removed. Upon removing all the remaining photoresist, a wiring structure projecting from the substrate surface is obtained.

Another prior art method of forming chip-level wiring is by a subtractive process known metal RIE (reactive ion etching). In this process, a blanket layer of metal is deposited on the semiconductor substrate. Then, using an RIE mask having a pattern of openings, which is of an inverse configuration to the desired wiring pattern, the metal layer is patterned by RIE.

Thus, both the above substrate and additive processes obtain a wiring structure which is nonplanar. To form a planarized structure, an insulator is then deposited followed by a polishing process to remove the insulator over the metal pattern. The above processes are not only cumbersome, but also the wiring formed by these methods is susceptible to breakage due to stresses induced during the polishing process. The resulting structure invariably tends to have an irregular or nonplanar surface due to the vagaries of the polishing process. As a result, the methods are unsuitable for high density wiring due to their dependence on lithographic definition of the photoresist or the RIE mask openings, as the case may be, and inherent limitations of conventional lithography and alignment tolerances.

Reference is made to "Metal Lift-Off Process with a Self-aligned Insulation Planarization" by A. J. Hoeg et al, IBM Technical Disclosure Bulletin, Vol. 24, No. 9, pp. 4839–4840, February 1982, which discloses a method of producing planarized metal wiring. In this process a metal strip is set into a wide aperture in a nitride layer and a repetitive series of fill-in steps is performed to build-up the gap that is produced on either side of the metal, in order to form a smooth surface.

Another article by G. T. Chiu et al in the IBM Technical Disclosure Bulletin, Vol. 25, No. 10, pp.

5309–5314, March 1983, shows dual-level metallization formed by using the results of the Hoeg et al process as a starting point.

U.S. Pat. No. 4,307,179 issued to Chang et al and assigned to the present assignee discloses a method for forming planar interconnection metallurgy in which a dual layer of an organic polymerized resin material and glass is formed on the substrate. By reactive ion etching grooves are made in the dual layer, followed by a conformal metal layer deposition and filling of the depressions in the metal by a photoresist. Planar photoresist is then applied, etched to expose the high spots of the metal layer and the etching continued down to the level of the glass.

U.S. Pat. No. 4,508,815 issued to Ackmann et al discloses a method of forming metallization embedded at different levels in a glass layer. After forming a thick glass layer having a partial aperture in correspondence with the intended contact region on a substrate, a photoresist having openings in correspondence with the partial aperture and the intended metal pattern is formed. Then, the partial opening is fully opened while simultaneously forming the grooves in the surface portion of the glass layer in accordance with the intended metal pattern. By lift-off, metallization is formed in the glass layer openings and grooves.

These prior art process which employ photoresist to permit deposition of the metal interconnection pattern selectively on the substrate, basically suffer from outgassing of the photoresist during the metal deposition step. This outgassing leads to corrosion of the metal pattern leading to electromigration, open failures and reliability degradation. Also, from a manufacturability standpoint, they tend to be too complex.

SUMMARY OF THE INVENTION

The disclosed process solves these and other problems by providing on the semiconductor substrate a dual layer of an insulator (e.g., silicon dioxide) and a hardened (moisture-free) photosensitive material (e.g., photoresist), the latter having (narrow and/or wide) openings therein in a pattern of the desired metallurgical pattern (contacts and/or interconnection wiring). The openings in the photosensitive layer have substantially vertical walls. This wall profile is achieved by utilizing conventional multi-layer resist (MLR) techniques which includes hardening of the photosensitive layer by, for example, thermal baking or ultra-violet radiation exposure. Using the patterned photosensitive layer as a mask, the vertical wall-profiled pattern therein is transferred to the underlying insulator layer by reactive ion etching. A metal layer of a thickness equal to the thickness of the insulator is deposited filling the wiring grooves and contact openings. Next, plugs of photosensitive material are formed in all the metal valleys. This is accomplished by applying a sacrificial, thick, dual, hardened photosensitive layer, the top layer thereof having a lower etch rate than that of the bottom layer, and obtaining a substantially planarized surface. The bottom layer is thin and conformal, while the top is thick and nonconformal. By subjecting the sacrificial layer to anisotropic reactive ion etching process it is removed leaving plugs of photosensitive material in the valleys of the metal layer. The exposed unwanted metal is then removed by etching. During this metal etch step the plugs serve as etch barriers for the underlying contacts and wiring. The photosensitive material constituting the plugs is then removed obtaining a metallurgical pattern coplanar with the insulator layer. This sequence of steps is repeated for multilevel writing.

BRIEF DESCRIPTION OF THE DRAWINGS

The novel features, process steps and their combination characteristic of the invention are set forth in the appended claims. The invention, however, will be best understood by reference to the detailed description which follows in conjunction with the accompanying drawings wherein:

DETAILED DESCRIPTION OF THE PREFERRED EMBODIMENT

Figure 1:
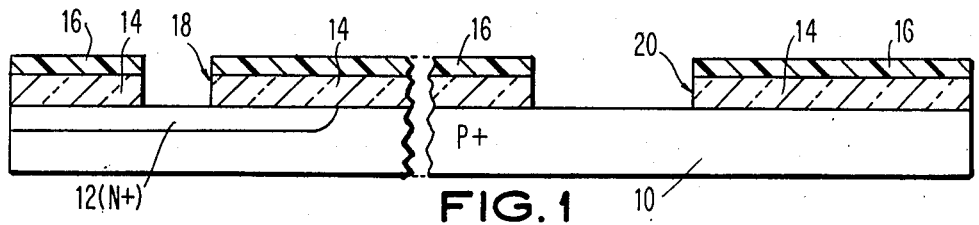
FIGS. 1–6 are diagrammatic cross-sectional views of a chip-level planar conductive structure at successive stages during its fabrication in accordance with the principles of the present invention.

Referring now to the drawings as illustrated in FIG. 1, 10 denotes a semiconductor substrate, illustratively a P type monocrystalline silicon substrate having active and/or passive devices fabricated therein and means for electrically isolating the devices from each other (not shown). A highly doped N type region, constituting the element of either an active or passive device, is indicated by numeral 12. The substrate 10 is covered with a suitable insulator 14 which functions as a passivation layer for the various integrated circuit elements formed on the substrate 10. The insulator material 14 is one which is compatible to the underlying substrate, gives rise to minimum wiring capacitance between stacked-/interlevel elements of the wiring and not susceptible to corrosion. Typically, the insulator 14 is silicon dioxide, silicon nitride or glass when the substrate is silicon. The thickness of the insulator 14 is typically in the range of 0.6–1.5 microns.

To form contact openings or vias in the insulator layer 14 for establishing electrical contact to the doped region 12 or forming interconnection wiring on the surface of substrate 10, openings are made in the layer 14 by forming an organic photosensitive layer 16 thereover. The openings in the layer 14 have a substantially vertical (i.e. $\geq 85°$) sidewall profile which is achieved by first forming openings in the photosensitive layer 16 the sidewalls of which have nearly vertical (i.e., $\geq 85°$) profile. A preferred method of forming these openings in layer 16 is by conventional multilayer resist (MLR) technique. For details of MLR technique reference is made to the article entitled "Multi-Layer Resist Systems as a Means to Submicron Optical Lithography" by B. J. Lin, IEDM Proceedings, pages 391–394, (1982), which is incorporated by reference herein. In this method a polymeric photosensitive material 16, preferably the AZ-4210 type photoresist comprised of a novolac-type phenol-formaldehyde resin and a photosensitive crosslinking agent and is commercially available from Shipley Corporation is applied to the insulator layer 14. Typical thickness of layer 16 is in the range 1.5–2.5 microns. The photoresist 16 is hardened by subjecting to a thermal bake step in vacuum at a temperature in the range 200°–300° C. for a short period of about 30–60 minutes. An alternative hardening process is by subjecting the resist to ultraviolet radiation of wavelength in the range of about 2000 to 3000 Å under vacuum conditions. This photoresist hardening step is crucial since it drives off any moisture or other contaminants which may otherwise outgass during a later metal deposition step and lead to corrosion of the metallurgy. Next, a thin (about 2000 Å thickness) insulating layer, preferably plasma oxide (not shown in FIG. 1) is deposited at a low temperature of about 90° C. Then, an imaging layer of a photoresist (not shown) is applied and soft-baked (at a temperature of about 80° C.). Next, using a photomask having a pattern of openings in accordance with the wiring pattern desired on the substrate 10, the top soft-baked photoresist is patterned by conventional etching. Thereafter, the exposed plasma oxide layer is etched by RIE in $CF_4$ to, in turn, expose the underlying photoresist layer 16. Then, by RIE in an oxygen ambient the hardened photoresist 16 is patterned. At the conclusion of this series of process steps, only the layer 16 and the plasma oxide on top thereof remain. The pattern in the photoresist 16 is then transferred by conventional etching, such as RIE, to the underlying insulator 14. During this RIE step, the then plasma oxide over the resist layer 16 will be removed leaving only the hardened resist layer 16 on top of insulator 14. For purposes of illustration is shown in FIG. 1 both narrow and wide contact/wiring openings 18 and 20, respectively.

Figure 2:
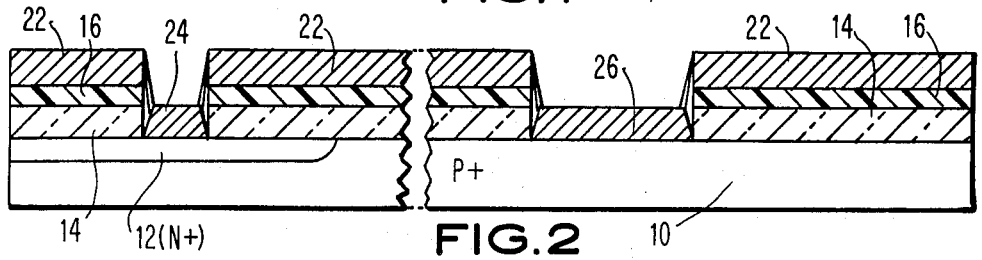

Continuing with the present process, next as shown in FIG. 2, a conductive layer 22 is deposited on the resultant surface of the substrate 10. For filling fine grooves, this deposition may be by RF or E-gun evaporation, typically, at a pressure of about $10^{-5}$–$10^{-7}$ torr and deposition rate of 500–1500 Å/minute. Alternatively, the conductive layer 22 may be formed by sputtering. The thickness of the conductive layer 22 should closely correspond to that of the insulator 14 so that the conductive material is filled in the vias/grooves 18 and 20 to a level substantially corresponding to that of the insulator 14 and a planar structure is realized. In addition to this coplanarity requirement, the thickness of the material 22 is governed by the desired conductivity of the metallurgy, the maximum compressive stress that the substrate 10 can withstand and the number of wiring plane in the structure. The thickness of layer 22 is typically in the range of 0.6–1.5 microns. The conductive material 22 can be any type of material suitable for interconnection metallurgy having the following properties: low resistivity, good adhesion to silicon and/or to the silicon passivation insulator 14, low contact resistance to silicon, good chemical and physical stabilities and easy to handle in manufacturing. Examples of such interconnection metallurgy are aluminum, aluminum alloys such as aluminum-copper and aluminum-silicon-copper, molybdenum, tungsten, and tantalum. Alternatively, prior to the deposition of layer 22, a thin barrier layer (not shown) of metallurgy such as titanium or titanium-tungsten alloy is deposited to promote adhesion of the layer 22 with the silicon 10 and also arrest interdiffusion of the metallurgy 22 into the silicon. Typical thickness of the barrier layer is in the range 1000–1500 Å. The narrow and wide conductive lines formed in the narrow and wide openings 18 and 20 are designated by 24 and 26, respectively.

Figure 3:
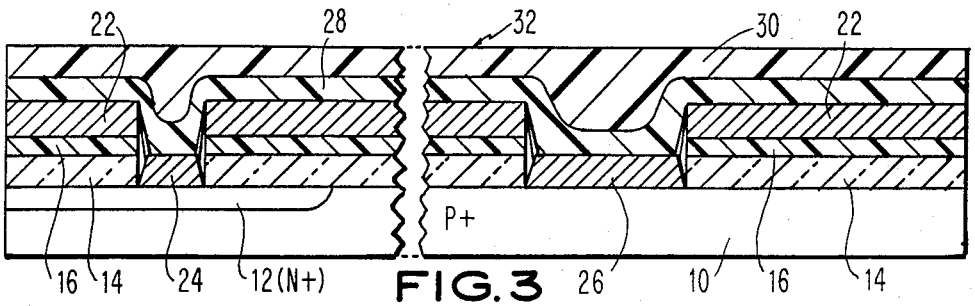
Figure 4:
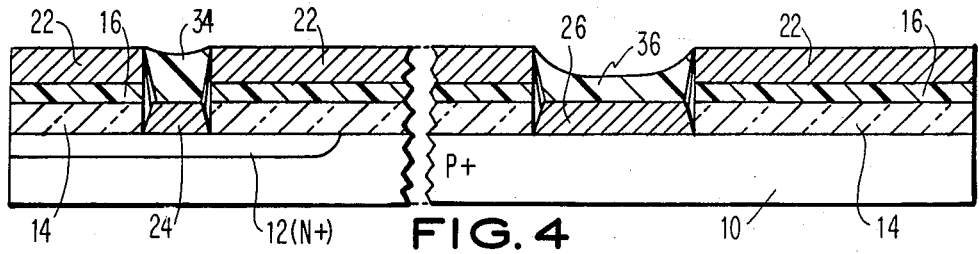

Progressing toward the structure of FIG. 3, next protective plugs are formed in the metal valleys (i.e., directly over the metal wiring 24 and 26) by utilizing a dual sacrificial photosensitive layer. Toward this end, first a thin conformal photosensitive layer 28 is applied by conventional spin-coat and drying technique. Drying is done, to harden the photosensitive layer, by heating to a temperature of 80°–200° C. One specific example of the drying technique consists of heating the photosensitive layer to temperatures of 80° C., 140° C. and 180° C. for 15 minute intervals at each temperature. Thereafter, a substantially thick photosensitive layer 30 is applied over the thin layer 28 to achieve a substantially planar surface 32. The thick photosensitive layer 30 is also hardened in a manner similar to hardening of layer 28 described hereinabove. The characteristics of the photosensitive layers 28 and 30 are such that the layer 30 etches at a slower rate than layer 28 under the same etching conditions. In other words, the layer 28 is selective to layer 30 during etching. A suitable material for layer 28 is a photoresist system containing tricyclodecane diazoquinone sensitizer and novolac-type resin. An example of the photosensitive layer 28 is a commercially available (from Shipley Corporation) AZ1350J type photoresist comprised of novolac-type resin with diazoquinone ethyl cellosolve acetate-xylin-N-butyl acetate polyvinyl methyl ether. An example of the photosensitive layer 30 is a terpolymer consisting of the following three monomers: (1) methyl methacrylate, (2) methacrylic acid, and (3) methacrylic acid anhydride. Preferred thicknesses of the photoresist layers 28 and 30 are in the ranges of 0.7–1.2 microns and 1–2 microns, respectively. The terpolymer is of a type which etches about three times slower than the AZ1350J type resist. The structure is then subjected to reactive ion etching in an oxygen gas ambient until the dual photoresist layer 28–30 is etched off and the underlying metal 22 is exposed. Since the starting surface of the sacrificial layer 28–30 during this anisotropic etching step is essentially planar, the photoresist plugs 34 and 36 over the wiring 24 and 26, respectively, will result at the completion of this etching step.

Figure 5:
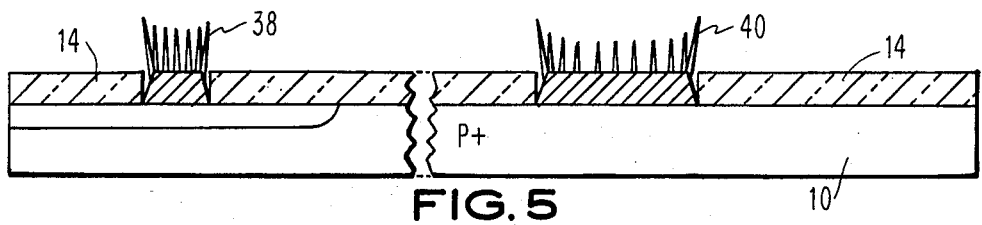

The next step in the present sequence of process steps, which is illustrated in FIG. 5, in subtractive etching of the exposed metal 22. For this purpose, either conventional wet or dry etching may be used. For example, an aluminum-copper alloy can be etched with a mixture of phosphoric acid and nitric acids at 35°±5° C. During this etch step, the metal wiring 24 and 26 is protected by the photoresist plugs 34 and 36, respectively.

Figure 6:
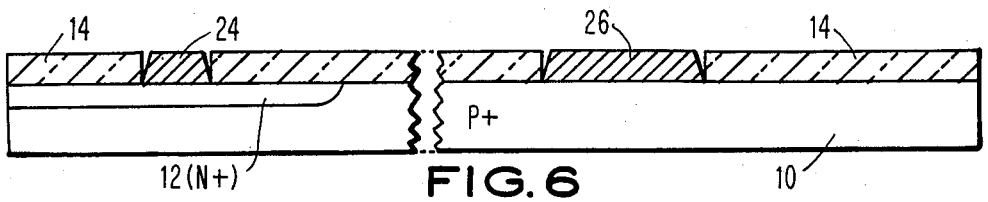

After stripping the metal 22 in the unwanted areas, the photoresist plugs 34 and 36 as well as the photoresist layer 16 are removed by conventional ashing, obtaining the structure shown in FIG. 5. The thin and fragile metal skirts or whiskers 38 and 40 protruding outwardly from the wiring 24 and 26, respectively, (and formed during the metal deposition step corresponding to FIG. 2) is removed obtaining the planar structure of FIG. 6. One way of removing 38 and 40 is by brush cleaning using a dilute etchant consisting of $H_3PO_4$, $CH_3COOH$, $HNO_3$ and $H_2O$. Alternatively, the structures 38 and 40 may be removed by a soft mechanical and chemical polishing process.

Figure 7:
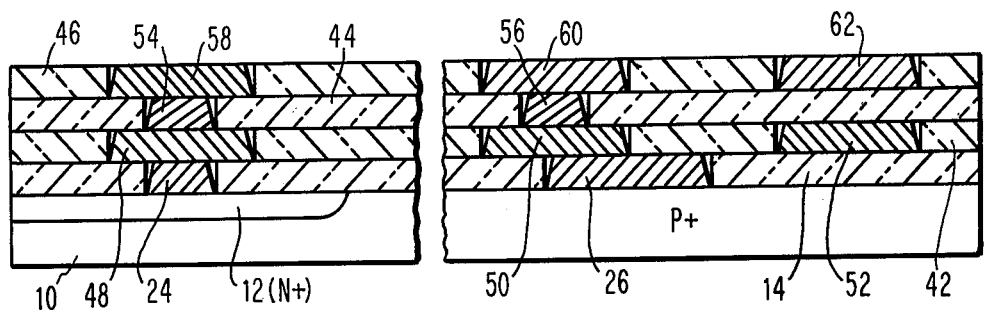
FIG. 7 is a planar multilevel conductive structure fabricated in accordance with the principles of the present invention.

As will be apparent to those skilled in the art, by repeating the sequence of process steps illustrated in FIGS. 1–6 a multilevel interconnection structure can be formed. FIG. 7 illustrates a finished structure after three further sequences of steps. The insulator corresponding to the second, third and fourth levels is designated by 42, 44 and 46. The wiring corresponding to the second level is designated by 48, 50 and 52; that for the third level is designated by 54 and 56; and the wiring for the fourth level is designated by 58, 60 and 62. As the layers are built up the surface of the interconnection pattern remains substantially planar. This permits the number of layers to be increased without regard to the problems which occur when the surfaces are not planar.

Figure 8:
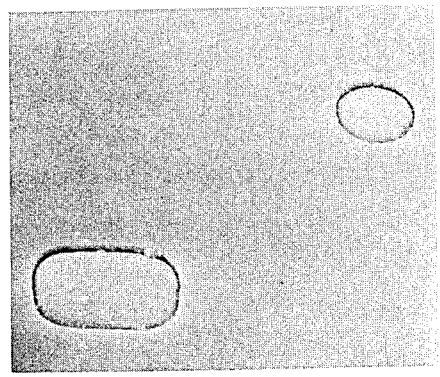
FIG. 8 is a scanning electron microscope (SEM) photograph of the top view of plugged contact holes in accordance with the invention.
Figure 9:
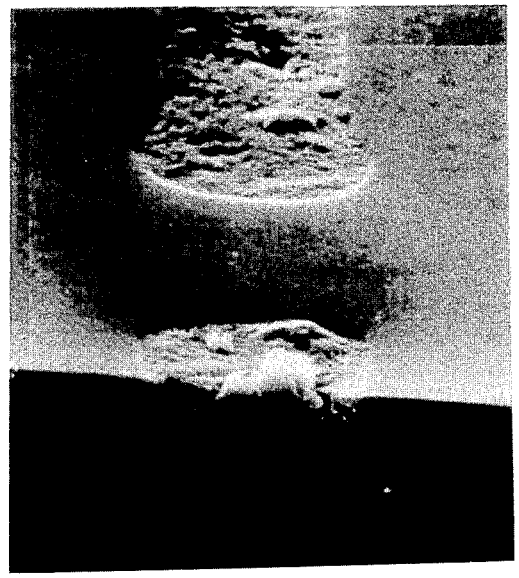
FIG. 9 is a SEM micrograph of the cross-sectional view of wiring in accordance with the present invention.

In FIG. 8 is presented a SEM micrograph (magnified 4000 times) of the top view of aluminum contact plugs formed in a silicon dioxide insulator layer by using the above described process. In FIG. 9 is shown a SEM micrograph (magnification 10,000) of a cross-sectional view of a double level metallization structure formed in accordance with the present process. The metallurgy and the inter-metal insulator in this case also are aluminum and oxide, respectively. As is clear from these figures, the metallization structure is leveled and the contact metallurgy completely fills the vias in the insulator.

Thus there has been provided a simple and reliable process of forming a planar chip-level interconnection structure which satisfies the objectives of interconnection strategy of very high density and performance integrated circuits. In addition to meeting the functionality, reliability and manufacturability requirements described hereinabove, the present process has several advantages. It does not necessitate any additional masks to achieve planarization regardless of whether the interconnection structure is single- or multi-level. It is capable of producing micron and submicron wide wiring/contacts, the latter being realized by utilization of stepped projection mask aligners (steppers). This process is free of prohibitively expensive insulator leveling techniques such as chemical-mechanical polishing and bias sputtered oxide deposition characteristic of prior art. Since the metallurgy is solely confined to the vias and grooves, electromigration reliability degradation and open failures at the edges of the contact vias are eliminated. Since the process provides perfectly planar surfaces, it is readily conducive for stacked vias formation thereby increasing wiring density.

While the invention has been described in conjunction with a specific preferred embodiment, it is evident that many alternatives, modifications and variations will be apparent to those skilled in the art in light of the foregoing description. For example, while the invention has been described in the context of forming an interconnection structure consisting of both narrow and wide wiring by utilizing a dual photosensitive sacrificial layer 28-30 (FIG. 3), the process can be modified as below when only narrow wiring is desired. In this case, the dual photosensitive layer 28-30 is substituted with a single, thick photosensitive sacrificial layer. The single photosensitive layer may be of the type of either of the layers 28 and 30 and is formed sufficiently thick to obtain a substantially planar surface. This single sacrificial layer is then etched to form plugs in the narrow wiring grooves using which as etch masks the unwanted metal is removed as previously described. While the invention has been described in the context of a silicon substrate, it is applicable to other substrates, such as gallium arsenide.

It is therefore contemplated that the appended claims will embrace any such alternatives, modifications and variations as fall within the true scope and spirit of the invention.

What is claimed is:

1. A process for forming a planar conductive interconnection on a substrate, comprising:
   providing a substrate covered with a dual layer of an insulator and hardened photosensitive material, said dual layer having wide and narrow openings exposing the substrate in correspondence therewith, said opening having substantially vertical walls;
   depositing a conductive layer filling said openings to the level of said insulator; forming on the resulting structure a sacrificial layer having a substantially planar surface despite said openings, said sacrificial layer being composed of a thin lower photosensitive layer and a thick upper photosensitive layer, said thick layer having a lower anisotropic etch rate than that of said thin layer under the same etching conditions;
   anisotropically etching said sacrificial layer to leave portions thereof in the form of plugs in contact with the conductive layer therein;
   removing the portion of the conductive layer exposed by the etching of said sacrificial layer; and
   removing said plugs and said hardened photosensitive material.

2. The process as recited in claim 1 wherein said lower photosensitive layer is conformal to said structure and said upper photosensitive layer is nonconformal to obtain said planar surface.

3. The process as in claim 2 wherein said upper photosensitive layer is composed of photoresist material.

4. The process as in claim 3 wherein said lower photosensitive layer is composed of photoresist material.

5. The process as in claim 4 further comprising hardening said upper and lower photoresist layers by subjecting to a baking process at a low temperature in the range 150°-220° C. in nitrogen ambient.

6. The process as in claim 2 wherein said hardened photosensitive material is photoresist.

7. The process as in claim 6 wherein said photoresist hardening comprises thermally baking in vacuum at a temperature in the range of 250°-300° C.

8. The process as in claim 6 wherein said photoresist hardening comprises exposing said photoresist to ultra-violet wavelength in the range of 2000-3000 Å.

9. The process as in claim 2 wherein said insulator is selected from the group consisting of silicon dioxide, glass and silicon nitride.

10. The process as recited in claim 2 wherein said conductive material is selected from the group consisting of aluminm, aluminum-copper, aluminum-silicon-copper, molybdenum, tantalum and tungsten.

11. A process for forming a planar multilayer metallurgical interconnection pattern on a substrate comprising:
   (a) forming an insulator layer on said substrate;
   (b) applying a first photoresist layer on said insulator layer;
   (c) hardening the first photoresist layer by removing the moisture therein;
   (d) patterning said photoresist to have a pattern of wide and narrow openings in the form of the desired metallurgical pattern, said openings having substantially vertical walls;
   (e) removing the resultant exposed areas of the insulator by reactive ion etching thereby forming openings having substantially vertical walls in said insulator;

(f) depositing over said substrate a blanket continuous conductive metal layer, said conductive layer having a mesa and a valley configuration conforming to the topograhphy on the surface of said substrate, the thickness of said metal layer being equal to the thickness of said insulator layer;

(g) forming on the resultant structure a dual photoresist layer having an essentially planar surface despite said topograhpy on the surface of said substrate by applying a thin lower photoresist layer conforming to the topography of said metal layer followed by a thick upper photoresist layer, said thin lower photoresist being characterized by selectivity with respect to said thick upper photoresist during etching thereof;

(h) reactive ion etching said dual layer to expose said metal mesas while leaving said metal valleys masked by said dual photoresist layer;

(i) etching said metal to remove metal above said first photoresist layer;

(j) removing said first photoresist and said dual photoresist corresponding to said metal valleys, thereby obtaining planar first level metallurgical pattern; and (k) repeating steps (a) through (j) for planar multilevel metallurgical pattern.

12. The process as recited in claim 11 wherein hardening of said first photoresist is accomplished by heating in vacuum at a temperature in the range of 250°-300° C.

13. The process as recited in claim 12 wherein hardening of said first photoresist is accomplished by subjecting said first photoresist to ultraviolet wavelength in the range of 2000-3000 Å.

14. The process as recited in claim 12 wherein said conductive metal layer is a sandwich structure composed of a relatively thin lower conductive layer and a relatively thick upper conductive layer.

15. The process as recited in claim 12 further comprising hardening each of said lower and upper photoresist layers.

16. The process as in claim 22 wherein said hardening comprises subjecting said lower and upper photoresist layers to a temperature of about 80°-200° C. for a short period.

17. The process as recited in claim 14 wherein said thin lower conductive layer is composed of a conductive material selected from the group consisting of titanium, tungsten and titanium-tungsten.

18. The process as recited in claim 14 wherein said thick upper conductive layer is selected from the group consisting of aluminum, aluminum-silicon, aluminum-silicon-copper, molybdenum, tantalum and tungsten.

19. The process as in claim 4, wherein the etch rate of said thin photoresist layer is about three times that of said thick photoresist layer.

20. A process for forming a planar thin film wiring for interconnection of integrated circuit devices on a substrate, comprising:

providing a substrate covered with a dual layer of an insulator and hardened first photosensitive material, said layer having openings of micron and submicron dimension exposing the substrate in correspondence therewith, each of said openings having substantially vertical walls;

depositing a conductive conformal layer filling said openings to the level of said insulator;

forming on the resulting structure a dual hardened photosensitive layer having a substantially planar surface despite said openings, said dual photosensitive layer being composed of a thin lower hardened photosensitive layer and a thick upper hardened photosensitive layer, said thin layer conforming to the topograhpy of said conductive thin and thick layer being nonconformal to obtain said substantially planar surface, said thin layer having an anisotropic etch rate about three times that of said thick layer;

anisotropically etching said dual photosensitive layer to leave portions thereof in the form of plugs in contact with said conductive layer;

removing portions of said conductive layer exposed by the etching of said dual photosensitive layer; and removing said plugs and said first photosensitive material.

21. The process as recited in claim 20 wherein said walls of the openings in said insulator have a sidewall profile equal to or exceeding 85 degrees.

* * * * *